United States Patent
King et al.

(10) Patent No.: US 11,751,466 B2
(45) Date of Patent: Sep. 5, 2023

(54) APPARATUS AND METHOD TO DELIVER ORGANIC MATERIAL VIA ORGANIC VAPOR JET PRINTING (OVJP)

(71) Applicant: Universal Display Corporation, Ewing, NJ (US)

(72) Inventors: Matthew King, Moorestown, NJ (US); Gregg Kottas, Ewing, NJ (US); Gregory McGraw, Yardley, PA (US); William E. Quinn, Whitehouse Station, NJ (US)

(73) Assignee: Universal Display Corporation, Ewing, NJ (US)

( * ) Notice: Subject to any disclaimer, the term of this patent is extended or adjusted under 35 U.S.C. 154(b) by 330 days.

(21) Appl. No.: 17/224,240

(22) Filed: Apr. 7, 2021

(65) Prior Publication Data
US 2021/0351385 A1  Nov. 11, 2021

Related U.S. Application Data

(60) Provisional application No. 63/022,631, filed on May 11, 2020.

(51) Int. Cl.
*B41J 2/14* (2006.01)
*H10K 71/00* (2023.01)
(Continued)

(52) U.S. Cl.
CPC .............. *H10K 71/00* (2023.02); *B41J 2/005* (2013.01); *B41J 2/14* (2013.01); *B41J 2/14145* (2013.01);
(Continued)

(58) Field of Classification Search
CPC ...... H10K 71/00; H10K 71/135; H10K 71/16; B41J 2/005; B41J 2/14; B41J 2/14145; B41J 2002/0055
See application file for complete search history.

(56) References Cited

U.S. PATENT DOCUMENTS 4,769,292 A   9/1988  Tang
5,247,190 A   9/1993  Friend
(Continued)

FOREIGN PATENT DOCUMENTS

WO   2008057394 A1   5/2008
WO   2010011390 A2   1/2010

OTHER PUBLICATIONS

Baldo et al.Highly efficient phosphorescent emission from organic electroluminescent devices, Nature, vol. 395, pp. 151-154, 1998.
(Continued)

*Primary Examiner* — Yaovi M Ameh
(74) *Attorney, Agent, or Firm* — Butzel Long

(57) ABSTRACT

Embodiments of the disclosed subject matter provide an apparatus having a device with a micronozzle array disposed on a micro-fabricated fluidic die. The device may include a first gas distribution plate and a second opposing plate, where the micro-fabricated fluidic die is disposed between the first gas distribution plate and the second opposing plate, wherein the first gas distribution plate is irreversibly joined to the micronozzle array with a seal that is gas-tight, and where the first gas distribution plate includes a plurality of sealed flow paths. A manifold may be reversibly joined to the first gas distribution plate, where the micro-fabricated fluidic die and the first gas distribution plate and the second opposing plate are disposed between the manifold. A thermally conductive plate may have at least one window that provides a clearance fit for the device across a range of motion relative to the thermally conductive plate.

20 Claims, 7 Drawing Sheets

(51) Int. Cl.
*H10K 71/13* (2023.01)
*H10K 71/16* (2023.01)
*B41J 2/005* (2006.01)

(52) U.S. Cl.
CPC .......... *H10K 71/135* (2023.02); *H10K 71/16* (2023.02); *B41J 2002/0055* (2013.01)

(56) References Cited

U.S. PATENT DOCUMENTS

| | | | |
|---|---|---|---|
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 6,984,080 | B2 * | 1/2006 | Silverbrook ............. B41J 11/08 347/85 |
| 7,279,704 | B2 | 10/2007 | Walters |
| 7,431,968 | B1 | 10/2008 | Shtein |
| 7,968,146 | B2 | 6/2011 | Wagner |
| 10,124,589 | B2 * | 11/2018 | Arthur ................... B41J 2/1632 |
| 10,328,695 | B2 * | 6/2019 | Choy ................... B41J 2/14145 |
| 2003/0230980 | A1 | 12/2003 | Forrest |
| 2004/0174116 | A1 | 9/2004 | Lu |
| 2013/0273239 | A1 * | 10/2013 | Harikrishna Mohan .................... B05B 1/3402 427/255.6 |
| 2017/0229663 | A1 | 8/2017 | Tsai |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

APPARATUS AND METHOD TO DELIVER ORGANIC MATERIAL VIA ORGANIC VAPOR JET PRINTING (OVJP)

CROSS-REFERENCE TO RELATED APPLICATIONS

This application claims priority to U.S. Patent Application Ser. No. 63/022,631, filed May 11, 2020, the entire contents of which are incorporated herein by reference.

FIELD

The present invention relates to high-temperature, low profile, bondable gas distribution and opposing plates for coupling jet heads to a larger gas delivery system for the delivery of organic material via Organic Vapor Jet Printing (OVJP), and devices and techniques including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, region, or device refers to one that emits light in the range of about 580-700 nm or having a highest peak in its emission spectrum in that region. Similarly, a "green" layer, material, region, or device refers to one that emits or has an emission spectrum with a peak wavelength in the range of about 500-600 nm; a "blue" layer, material, or device refers to one that emits or has an emission spectrum with a peak wavelength in the range of about 400-500 nm; and a "yellow" layer, material, region, or device refers to one that has an emission spectrum with a peak wavelength in the range of about 540-600 nm. In some arrangements, separate regions, layers, materials, regions, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general, there are two classes of color altering layers: color filters that modify a spectrum by removing unwanted wavelengths of light, and color changing layers that convert photons of higher energy to lower energy. A component "of a color" refers to a component that, when activated or used, produces or otherwise emits light having a particular color as previously described. For example, a "first emissive region of a first color" and a "second emissive region of a second color different than the first color" describes two emissive regions that, when activated within a device, emit two different colors as previously described.

As used herein, emissive materials, layers, and regions may be distinguished from one another and from other structures based upon light initially generated by the material, layer or region, as opposed to light eventually emitted by the same or a different structure. The initial light generation typically is the result of an energy level change resulting in emission of a photon. For example, an organic emissive material may initially generate blue light, which may be converted by a color filter, quantum dot or other structure to red or green light, such that a complete emissive stack or sub-pixel emits the red or green light. In this case the initial emissive material or layer may be referred to as a "blue" component, even though the sub-pixel is a "red" or "green" component.

In some cases, it may be preferable to describe the color of a component such as an emissive region, sub-pixel, color altering layer, or the like, in terms of 1931 CIE coordinates. For example, a yellow emissive material may have multiple peak emission wavelengths, one in or near an edge of the "green" region, and one within or near an edge of the "red" region as previously described. Accordingly, as used herein, each color term also corresponds to a shape in the 1931 CIE coordinate color space. The shape in 1931 CIE color space is constructed by following the locus between two color points and any additional interior points. For example, interior shape parameters for red, green, blue, and yellow may be defined as shown below:

| Color | CIE Shape Parameters |
|---|---|
| Central Red | Locus: [0.6270, 0.3725]; [0.7347, 0.2653]; Interior: [0.5086, 0.2657] |
| Central Green | Locus: [0.0326, 0.3530]; [0.3731, 0.6245]; |
| Central Blue | Interior: [0.2268, 0.3321 Locus: [0.1746, 0.0052]; [0.0326, 0.3530]; Interior: [0.2268, 0.3321] |
| Central Yellow | Locus: [0.373 1, 0.6245]; [0.6270, 0.3725]; Interior: [0.3 700, 0.4087]; [0.2886, 0.4572] |

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, an apparatus may include a device having a micronozzle array disposed on a micro-fabricated fluidic die. The device may include a first gas distribution plate and a second opposing plate, where the micro-fabricated fluidic die is disposed between the first gas distribution plate and the second opposing plate. A first gas distribution plate may be irreversibly joined to the micronozzle array with a seal that is gas-tight, where the first gas distribution plate includes a plurality of sealed flow paths. A manifold may be reversibly joined to the first gas distribution plate, where the micro-fabricated fluidic die and the first gas distribution plate and the second opposing plate may be disposed between the manifold. The apparatus may include a thermally conductive plate in thermal contact with an active cooling source, where the thermally conductive plate has at least one window passing through its full thickness through which the first gas distribution plate and the second opposing plate, a portion of the micro-fabricated fluidic die, and the micronozzle array of the device protrude such that a short axis of a cross-section of the window provides a clearance fit for the device across a range of motion relative to the thermally conductive plate. The apparatus may include one or more thermal evaporation sources in fluid communication with the first gas distribution plate where the manifold may in fluid communication with the micronozzle array through the plurality of sealed flow paths within the first gas distribution plate.

The micronozzle array of the device may be disposed on an edge of the micro-fabricated fluidic die. The micronozzle array may be disposed on a face of the micro-fluidic die.

The micro-fabricated fluidic die of the device may include at least one of silicon, quartz, and/or metal.

The second opposing plate of the device may be a second gas distribution plate, where the manifold is joined to the first gas distribution plate with a seal that is gas-tight.

At least one of the plurality of sealed flow paths of the device may be configured to carry a mixture of organic vapor and inert carrier gas.

The first gas distribution plate of the device may have a segment proximal to the micronozzle array through which all flow paths pass, and an aspect ratio of a depth of the segment is no more than 10% of the width or height of the segment. As used throughout, the depth may be a direction normal to a face of the micronozzle array.

The thermally conductive plate of the apparatus may shield objects upon which the micronozzle array acts from heat generated by the manifold and the plurality of evaporation sources.

The seal of the device may be a gasket or a joint. The micronozzle array of the device may be irreversibly joined to the first gas distribution plate and the second opposing plate to form the seal using glass frit, ceramic adhesives, bonding, and/or a solder or braze compound with a reflow temperature that is greater than 350° C., or is greater than 500° C. The first gas distribution plate of the device may include a material that has an average coefficient of thermal expansion of less than $6\times10^{-6}$ $K^{-1}$ between room temperature and a reflow temperature of the solder.

The first gas distribution plate and second opposing plate of the device may be fabricated from at least one of molybdenum, tungsten, kovar, aluminum nitride, and/or silicon nitride.

The apparatus may include a heater that is thermally coupled to the micronozzle array, where the heater is configured to heat the micronozzle array. The micronozzle array may direct convective jets of gas onto a surface of a substrate.

The micronozzle array and a substrate of the apparatus may be configured to move relative to one another.

The micro-fabricated fluidic die and the micronozzle array of the device may be comprised of silicon.

The thermally conductive plate may have a window that is lined with an insulative material. The micronozzle array and the first gas distribution plate may comprise at least a portion of the device that protrudes through the window of the thermally conductive plate such that the normal plane of the device is parallel to the depth dimension of the first gas distribution plate.

The first gas distribution plate and the second opposing plate of the device may include resistive heaters. The first gas distribution plate and second opposing plate of the device may include one or more thermally insulating materials selected from quartz, borosilicate glass, aluminum oxide, and/or mica. At least one of the first gas distribution plate and second opposing plate of the device may be configured for gas to be fed through.

The apparatus may include deformable metal gaskets, where the first gas distribution plate is sealed to the manifold using the deformable metal gaskets. The deformable metal gaskets may be reversibly sealed to the device. The deformable metal gaskets may be comprised of a material that is integrated with the manifold.

The first gas distribution plate of the device may be comprised of a plurality of etched or milled layers of material that are bonded together using a formation temperature greater than the reflow temperature of a material used to join the micronozzle array to the first gas distribution plate.

According to an embodiment, an apparatus may include a device having a micronozzle array. The device may include a first gas distribution plate that is irreversibly joined to the micronozzle array with a seal that is gas-tight, where the first gas distribution plate includes a plurality of sealed flow path. One or more thermal evaporation sources of the device may be in fluid communication with the first gas distribution plate. The device may include a manifold, where the first gas distribution plate is reversibly joined to the manifold. The manifold may be in fluid communication with the micronozzle array through the plurality of sealed flow paths within the first gas distribution plate. At least one of these flow paths may carry a mixture of organic vapor and inert carrier gas. The first gas distribution plate may have a segment proximal to the micronozzle array through which all flow paths pass and a depth of the segment no wider than a depth of the micronozzle array at its point of attachment, where the depth may be a direction normal to the micronozzle array face. The apparatus may include a thermally conductive plate, where the first gas distribution plate and the thermally conductive plate are in thermal contact with a source of active cooling. The thermally conductive plate may have at least one window passing through its full thickness through which the device may protrude such that a short axis of a cross section of the window has a dimension to provide a clearance fit at least for at least the micronozzle array of the device across a range of motion of the device relative to the thermally conductive plate so that the thermally conductive plate shields objects upon which the micronozzle array acts from heat generated by the manifold and the one or more thermal evaporation sources.

The seal of the device may be a gasket or a joint. The micronozzle array of the device may be irreversibly joined and/or attached to the device using, for example, glass frit, ceramic adhesives, bonding, and/or a solder or braze compound with a reflow temperature that may be greater than 350° C., or greater than 500° C. The first gas distribution plate may comprise a material that has an average coefficient of thermal expansion of less than $6\times10^{-6}$ $K^{-1}$ between room temperature and a reflow temperature of the solder. The device may comprise at least one of molybdenum, tungsten, kovar, aluminum nitride, and/or silicon nitride.

The apparatus may include a heater that is thermally coupled to the micronozzle array, where the heater is configured to heat the micronozzle array.

The micronozzle array of the device may direct convective jets of gas onto a surface of a substrate. The micronozzle array and a substrate are configured to move relative to one another. The micronozzle array may be comprised of silicon.

The thermally conductive plate of the apparatus may comprise a window that is lined with an insulative material.

The device may include deformable metal gaskets, where the first gas distribution plate is sealed to the manifold using the deformable metal gaskets. The deformable metal gaskets may be reversibly sealed to the device. In some embodiments, the deformable metal gasket is comprised of a material that is integrated with the manifold.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
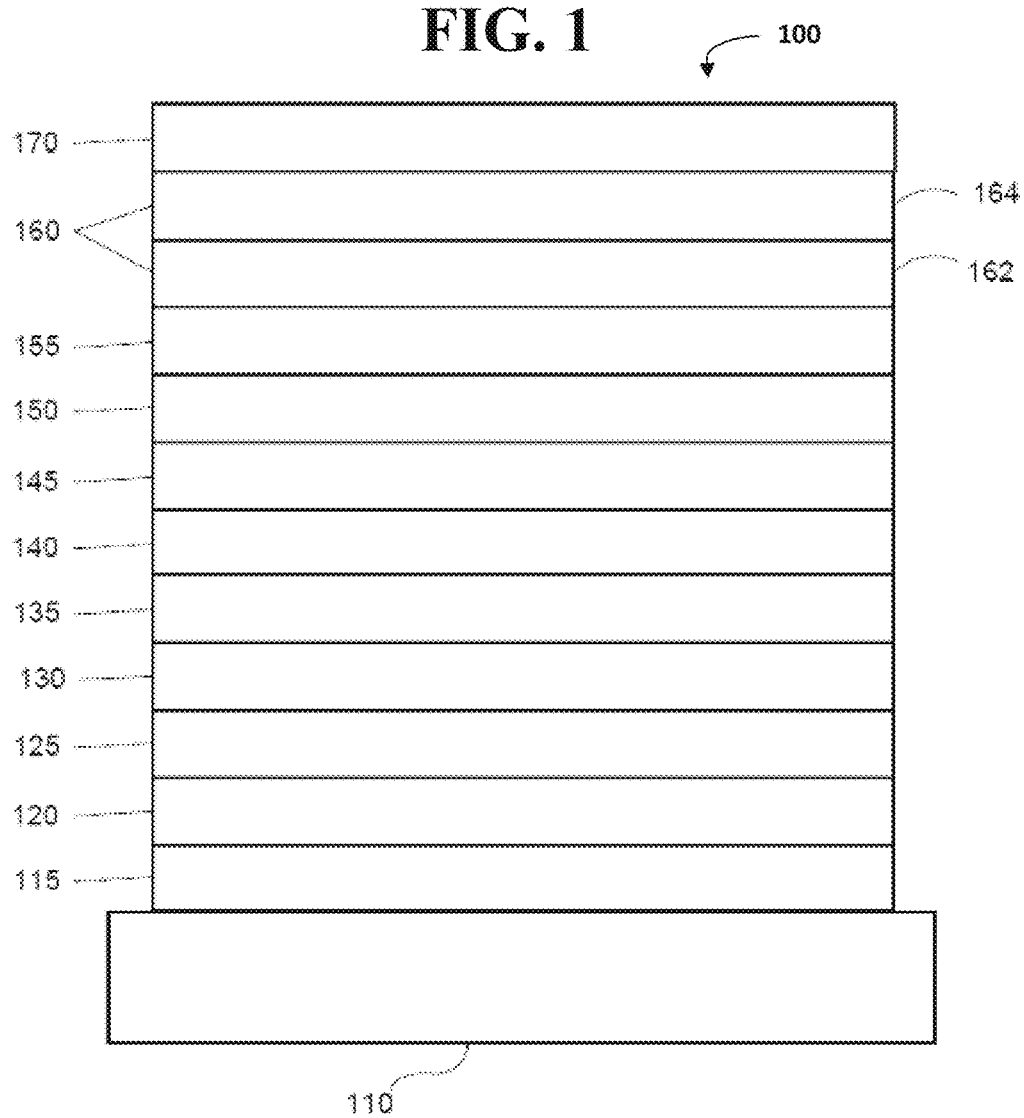
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
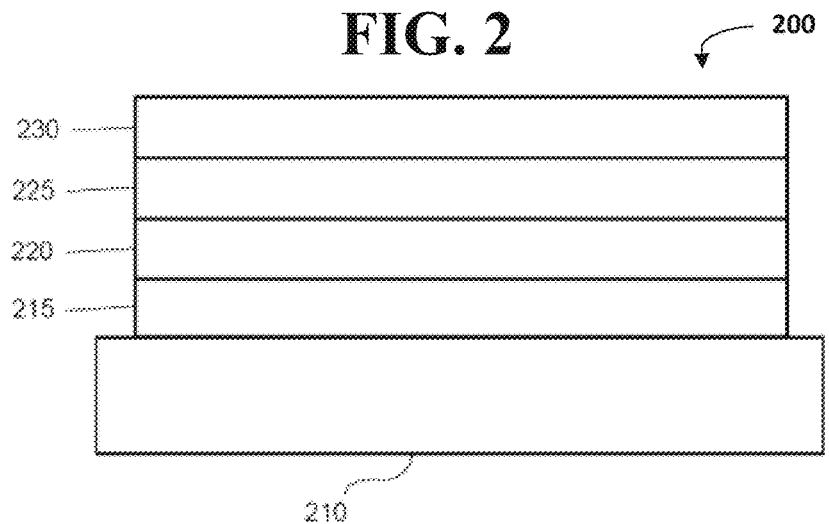
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for interventing layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, we define optically active metamaterials as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer , and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the thermal population between the triplet states and the singlet excited states. Compounds that are capable of generating E-type delayed fluorescence are required to have very small singlet-triplet gaps. Thermal energy can activate the transition from the triplet state back to the singlet state. This type of delayed fluorescence is also known as thermally activated delayed fluorescence (TADF). A distinctive feature of TADF is that the delayed component increases as temperature rises due to the increased thermal energy. If the reverse intersystem crossing rate is fast enough to minimize the non-radiative decay from the triplet state, the fraction of back populated singlet excited states can potentially reach 75%. The total singlet fraction can be 100%, far exceeding the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta E_S$-T). Organic, non-metal containing, donor-acceptor luminescent materials may be able to achieve this. The emission in these materials is often characterized as a donor-acceptor charge-transfer (CT) type emission. The spatial separation of the HOMO and LUMO in these donor-acceptor type compounds often results in small $\Delta E_S$-T. These states may involve CT states. Often, donor-acceptor luminescent materials are constructed by connecting an electron donor moiety such as amino- or carbazole-derivatives and an electron acceptor moiety such as N-containing six-membered aromatic ring.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Embodiments of the disclosed subject matter provide a high-temperature, low profile, bondable gas distribution and opposing plates for coupling jet heads to a larger gas delivery system for the delivery of organic material via Organic Vapor Jet Printing (OVJP). The bonded assembly allows for the efficient delivery of hot material to a surface of a substrate, with minimum heat load to the substrate.

Figure 3:
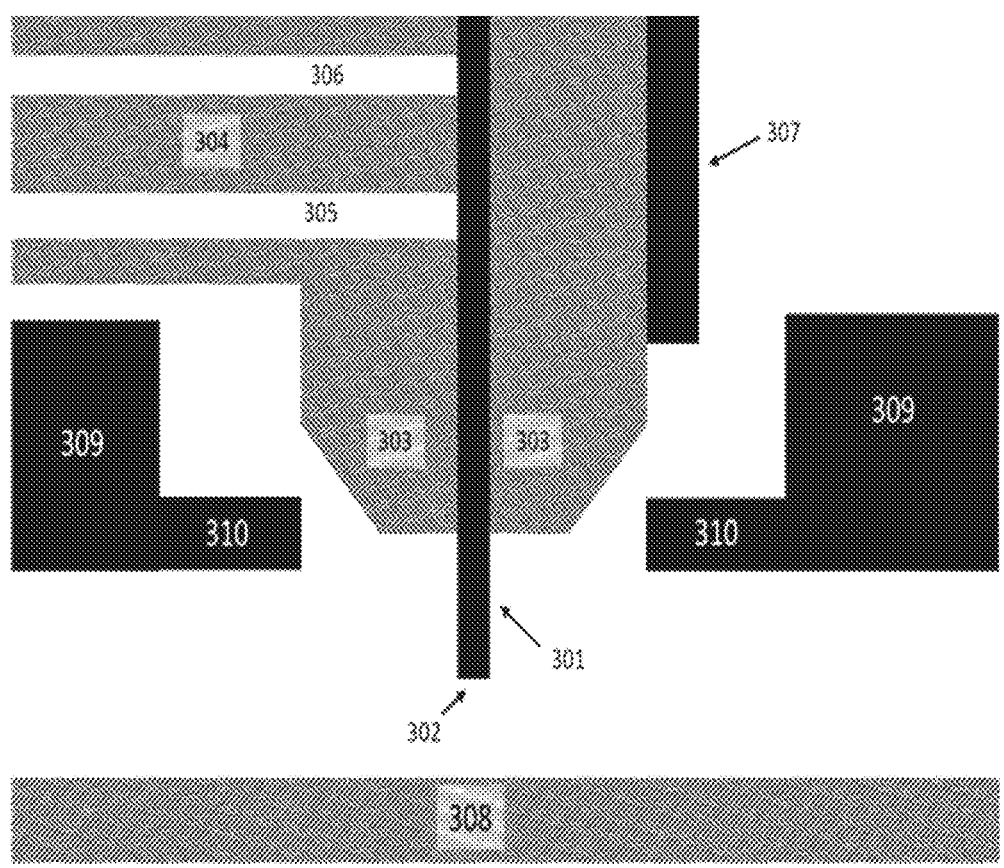
FIG. 3 shows an OVJP jet head in which the micronozzle array is located on the edge of a microfabricated die.

In an example OVJP system as shown in FIG. 3, the microfabricated die 301 contains a micronozzle array 302 along its lower edge. The die 301 is typically made from silicon, but other materials may be used as well. The die 301 is clamped between two heated plates 303. At least one plate of the clamp is connected to a heated manifold 304 that feeds organic vapor entrained in an inert carrier gas into the die through a run line 305 extending from the manifold 304, through the plate 303, to one or more vias on the face of the die 301. At least one plate 303 of the clamp has an exhaust line 306 that connects a via on the die 301 with a low-pressure reservoir to withdraw process gas and surplus organic vapor from the printing zone. A heater 307 may be connected to one or more plates 303 of the clamp, as well as to the manifold 304. The microfabricated die 301 and the device that holds it and connects it to the heated manifold 304 is referred to as a jet head.

The temperature of a substrate influences the morphology of the deposited film. In order to control the morphology, it is important to control the thermal load on the surface. A temperature-controlled plate, or cold plate, is placed between the print head and substrate 308. The cold plate has a thick portion 309 to allow efficient conduction of heat to a coolant loop, but it has a thinner portion 310 near the micronozzle array. This thinner portion 310 is a less effective heat shield than the thick portion 309, but the form factor of the clamp assembly requires that material be removed from the cold plate to accommodate the clamp so that the micronozzle array may be brought into proximity to the substrate 308. The micronozzle array must be kept hot, so the tip of the die may only protrude a short distance from the clamp. The requirements of thermal uniformity, hermetic sealing, and mechanical rigidity limit the degree to which the clamp may be miniaturized. The window in the cold plate must be wide enough to accommodate a portion of the clamp surrounding the die 301. The clamp is therefore only partially shielded from the substrate 308, and the shielded sections of it are only shielded by a portion of the cold plate that is thinner than optimal.

Embodiments of the disclosed subject matter decrease the thermal load placed on the substrate by the OVJP mechanism by providing a gas distribution plate that permits as much of the assembly as possible to remain shielded by a thick cold plate during operation.

Embodiments of the disclosed subject matter provide a high temperature, low profile, bondable gas distribution and opposing plates for connecting a microfluidic device made of silicon or other material with a larger gas delivery system. The gas distribution and opposing plates may have a low profile in the depth direction, while being comparatively tall and wide. This arrangement may provide a minimum cross-sectional area of heated jet head facing the substrate, while permitting a thick cold plate to surround the gas distribution and opposing plates and thermally isolate the remainder of the heated OVJP components from the substrate.

Operating at high temperatures within a high purity vacuum environment may present challenges when trying to seal a fluid connection at the interface of two parts. The highest operating temperatures for conventional polymer seals are around 300° C., with many much lower. Outgassing may be a problem, even with high-temperature rated polymers. Although metal seals may operate at high temperature, metal and polymer seals often use additional fixturing for assembling, such as bolting, which adds to the physical size of the gas distribution and opposition plates. Heat transfer within the OVJP mechanism may be controlled, because some components of the OVJP mechanism may be hot, while other components may be thermally sensitive. Additional size in the fixture adds to the thermal load on the system components, which can be undesirable. The gas distribution and opposing plates disclosed herein may serve as a pass-through device to move fluid from one thermal region, through a window in a cold plate and into another region, and may reduce the thermal loads on the system. This permits the substrate to be most effectively shielded from heat generated by the evaporation sources and connecting manifold.

The gas distribution and opposing plates disclosed herein may be useful in Organic Vapor-Jet Printing (OVJP). OVJP is a system where organic material is communicated to a substrate via hot carrier gas, where a micronozzle array needs to be coupled to a macroscopic assembly for heating material and entraining it in a vapor stream. The vapor stream cannot cool along its path, and the process equipment may not transfer excessive heat to the substrate. By reducing the size of the portion of the printhead assembly exposed to the substrate and by using shielding or cooled interfaces, the thermal load can be more easily managed.

Figure 4A:
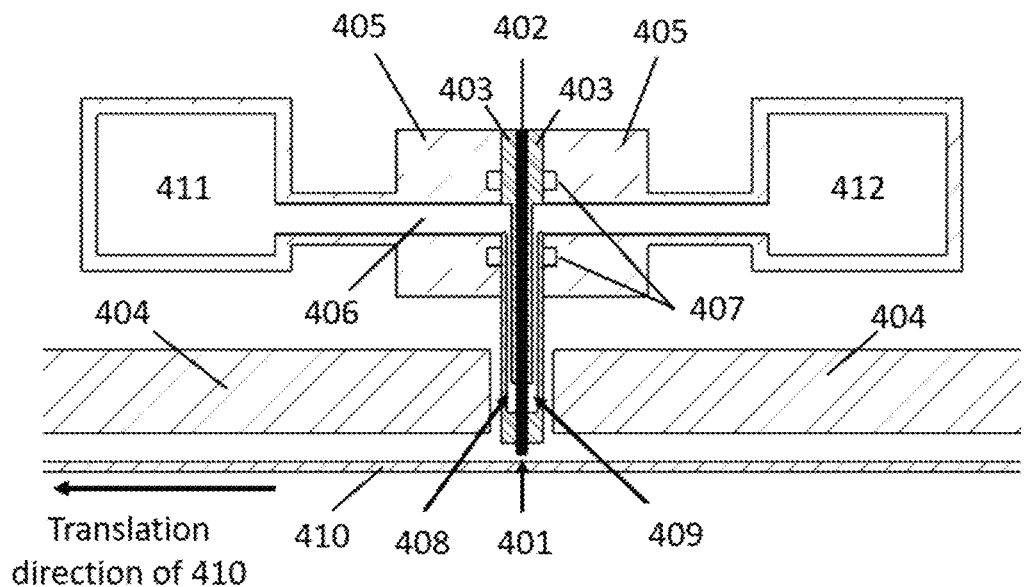
FIG. 4a shows an OVJP jet head with a micronozzle array is located on the edge of a microfabricated die that incorporates a gas distribution plate and opposing plate according to an embodiment of the disclosed subject matter.

FIG. 4a shows an apparatus according to embodiments of the disclosed subject matter. A micronozzle array 401, which may be similar to a micronozzle array that is a plane normal to its apertures, and may have one or more delivery apertures in fluid communication with the flow of inert carrier gas and organic vapor. The delivery apertures may be flanked on each side by exhaust apertures that are in fluid communication with the exhaust line. The micronozzle array 401 may be disposed at the edge of a silicon die 402 that is disposed between plates 403. The plates 403 may include a first gas distribution plate and a second opposing plate. The micronozzle array 401, the silicon die 402, and the plates 403 may protrude through a cold plate 404. The micronozzle array 401 may be in proximity to a substrate 410 where the deposition will be targeted. The die 402 may be irreversibly sealed to one or more of the gas distribution and opposing plates using a method such as glass frit, ceramic adhesives, bonding, soldering or brazing. In some embodiments, the die 402 may be attached to a gas distribution plate. The gas distribution plate of plates 403 may be mechanically attached to the interface manifold block 405, and may seal the one or more fluid paths 406 using high temperature seals in a gland feature 407. At least one of the plates 403 has a channel 408 that may feed organic vapor entrained in an inert carrier gas into the die 402 from a manifold connected to one or more organic vapor sublimation sources 411. At least one of the plates 403 may include an exhaust line 409 that connects a via on the die 402 with a low-pressure reservoir 412 to withdraw process gas and surplus organic vapor from a printing zone.

Figure 4B:
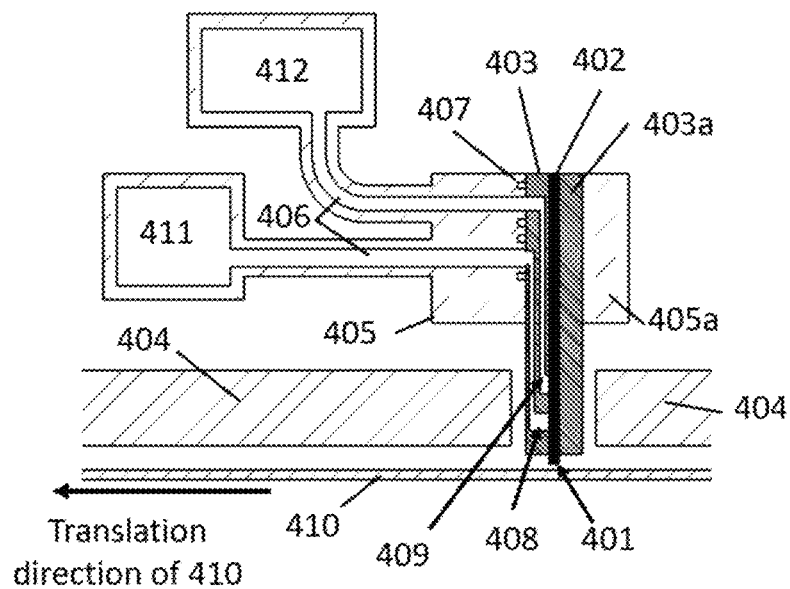
FIG. 4b shows an OVJP jet head with a micronozzle array is located on the edge of a microfabricated die that incorporates a gas distribution plate where both supply and exhaust are plumbed from same side of assembly according to embodiments of the disclosed subject matter.

FIG. 4b shows an alternative arrangement of FIG. 4a, where the organic vapor channel 408 and the exhaust line 409 may be drawn through the same plate 403. The opposing plate 403a and manifold block 405a may not include any internal channels, and, as such, may not use gas tight seals at their interfaces.

Figure 5A:
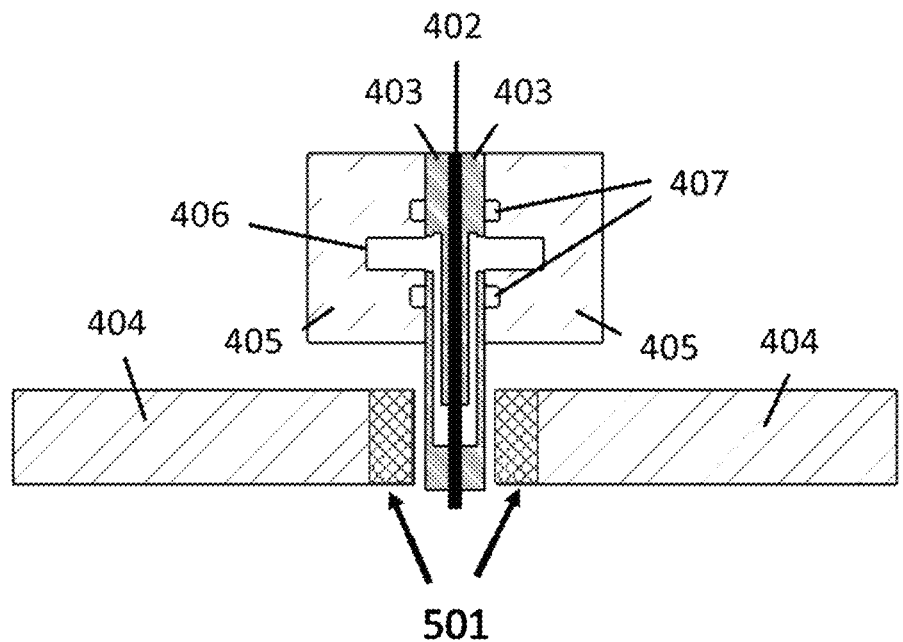
FIG. 5a shows an OVJP jet head with a micronozzle array is located on the edge of a microfabricated die that includes a gas distribution plate and opposing plate with additional thermal insulation surrounding the window in the cold plate according to embodiments of the disclosed subject matter.
Figure 5B:
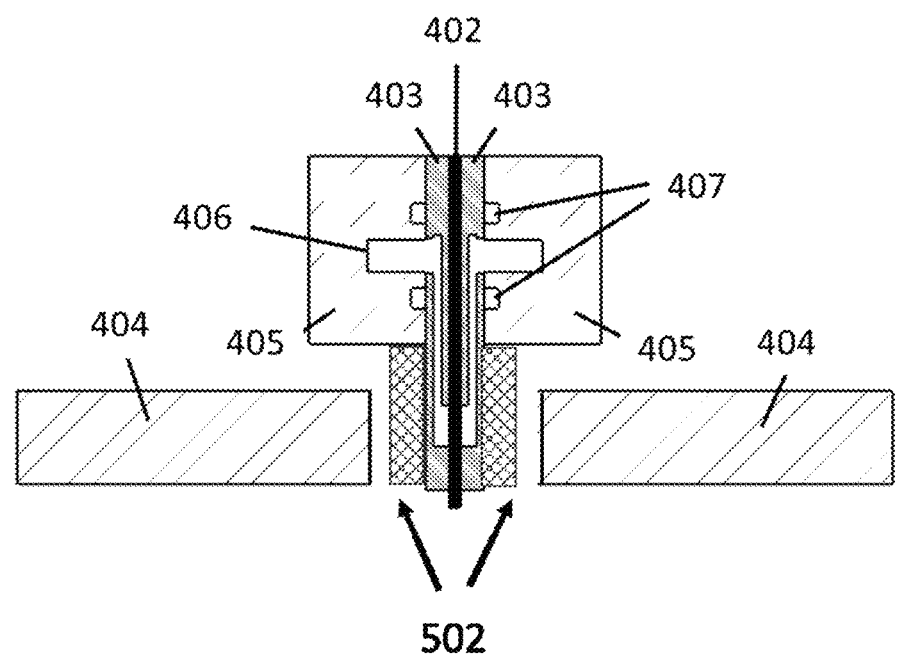
FIG. 5b shows an OVJP jet head with a micronozzle array is located on the edge of a microfabricated die that includes the gas distribution plate and opposing plate with additional thermal insulation creating a sheath around the gas distribution and opposing plates according to embodiments of the disclosed subject matter.

FIG. 5a shows an alternative arrangement to the embodiment shown in FIG. 4a. The arrangement shown in FIG. 5a may include thermally insulating material 501, such as quartz or borosilicate glass, which may be attached to the perimeter of the window in the cold plate 404. The insulating material 501 may be used to maintain a temperature gradient so that the plates 403 stay hot and cold plate 404 stays cold. That is, the plates 403 may have a predetermined hot temperature that is greater that a predetermined cold temperature of the cold plate 403. An alternate embodiment is shown in FIG. 5b, where thermally insulating sheets may sheath and/or cover the outer surfaces of the plates 403 and a microfabricated die assembly. Of the embodiments shown in FIGS. 5a-5b, the embodiment shown in FIG. 5a may be preferred, as it reduces a cross section dimension of a heated jet head proximal to the substrate 410.

The plates 403 may include channels and/or holes that are stacked and bonded. The bonding may be vacuum braze, diffusion bonding, soldering, glass frit, ceramic adhesive, or the like. The bonding may allow for complex internal geometries which may reduce the profile of the plates 403. The final bonded part may have multiple leak tight fluid passages, each connecting an inlet to an outlet orifice. If solder, braze, or welding techniques are used to fabricate one or more of the plates 403, the temperature of formation may be greater than that of the braze or solder used to affix the plates 403 to the die 402 that includes the micronozzle array 401. The material used for the plates 403 may be matched to the coefficient of thermal expansion (CTE) of silicon to avoid fracturing the silicon due to differential expansion of the mated materials. Some examples of materials that match the CTE of silicon may include molybdenum, tungsten, quartz, kovar, aluminum nitride, and the like. The average CTE between room temperature and the liquids of the material used to solder or braze the micronozzle array 401 to the gas distribution and opposing plates may be less then $6 \times 10^{-6}$ K$^{-1}$. By matching expansions, the silicon die 402 and plates 403 may be bonded to eliminate another sealing interface.

The silicon die 402 including the micronozzle array 401 may be indirectly heated by a heater attached to the clamping plates, in a similar manner to heater 307 that may be connected to one or more plates 303 of the clamp shown in FIG. 3. Surface-to-surface metal contacts may have greater thermal resistivity than soldered contacts so the clamp must be heated to a temperature much greater than that desired at the tip of the silicon die 402. Embodiments of the disclosed subject matter may compensate by adjusting the heaters to a higher temperature set point. A bonded interface between the silicon die 402 and the plates 403 may provide a more efficient thermal conduction and the heater temperature may be reduced accordingly. This may further lower both the heat load on the substrate 410 and the cooling requirements for the OVJP tool.

Heat transfer to the substrate may be limited by a temperature-controlled plate mounted between the hot assembly and substrate. Areas of the temperature-controlled plate may be cut out so the micronozzle and its support structures can pass through and be closer to the substrate without exposing all the hot components. Since bonding also removes the fasteners needed to clamp and seal the silicon at its gas interface, the overall size is of these structures may be reduced. Therefore, a smaller cutout window may be made in the plate further reducing the heat load to the substrate.

Figure 6:
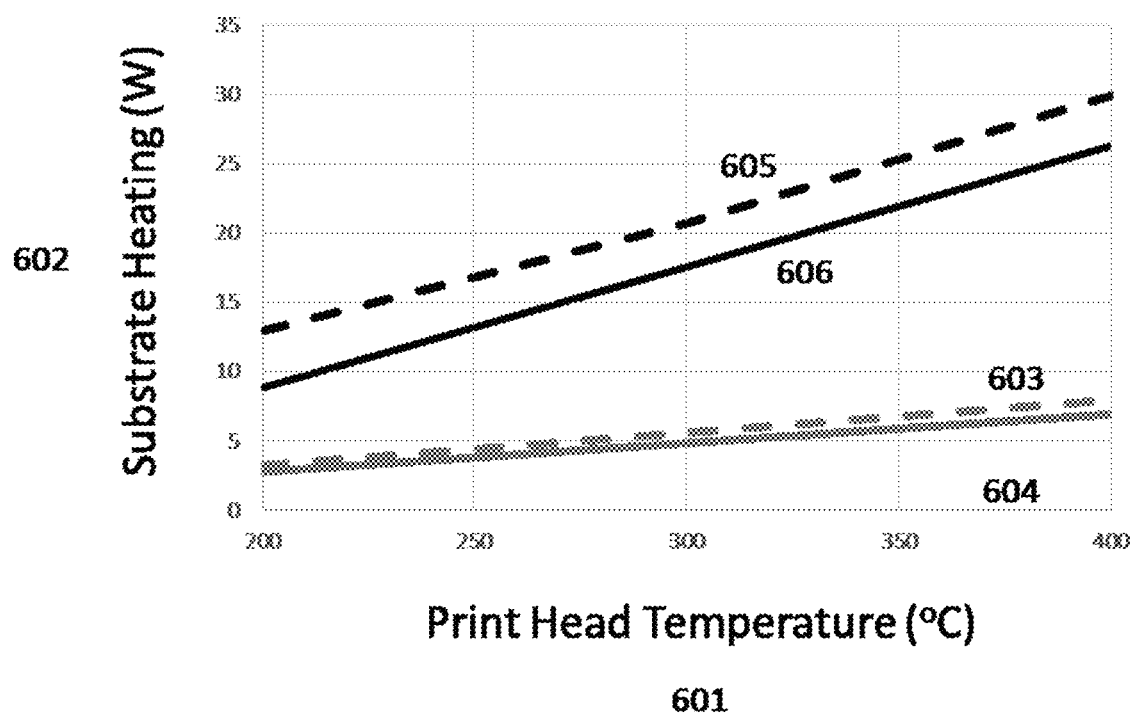
FIG. 6 shows the heat load placed on a substrate by the OVJP jet head according to embodiments of the disclosed subject matter.

FIG. 6 shows a comparison of the heat transfer between a conventionally mounted jet head to a substrate and the heat transfer to a substrate using an embodiment of the disclosed invention as shown in FIG. 4a. The temperature of the jet head may be indicated on the horizontal axis 601 in degrees Celsius, while the rate of heat transfer to a substrate positioned 50 μm away from the micronozzle array at the tip of the jet head may indicated by the vertical axis 602 in Watts. The dashed gray line 603 may show the rate of heat transfer versus temperature for an OVJP jet head of standard construction shown in FIG. 3, and the solid gray line 604 may show the rate of heat transfer versus temperature for an OVJP jet head using an embodiment of the disclosed subject matter as shown in FIG. 4a. The device shown in FIG. 4a may reduce the thermal load on the substrate by approximately 12% over its operating envelope. This may be due both to the lower thermal mass and cross section of the plates 303 compared with the present clamp and the smaller window in the cold plate 404 permitted by the plates 403, which may allow the cold plate 404 to better shield the substrate 410 from heat generated by the sublimation sources and the manifold linking them to the plates 403. The absence of a milled depression in the cold plate 404 to accommodate the clamping hardware may improve thermal isolation between the substrate and heated OVJP components. Lines 605 and 606 shown in FIG. 6 are discussed below in connection with the embodiments shown in FIG. 8.

Figure 7:
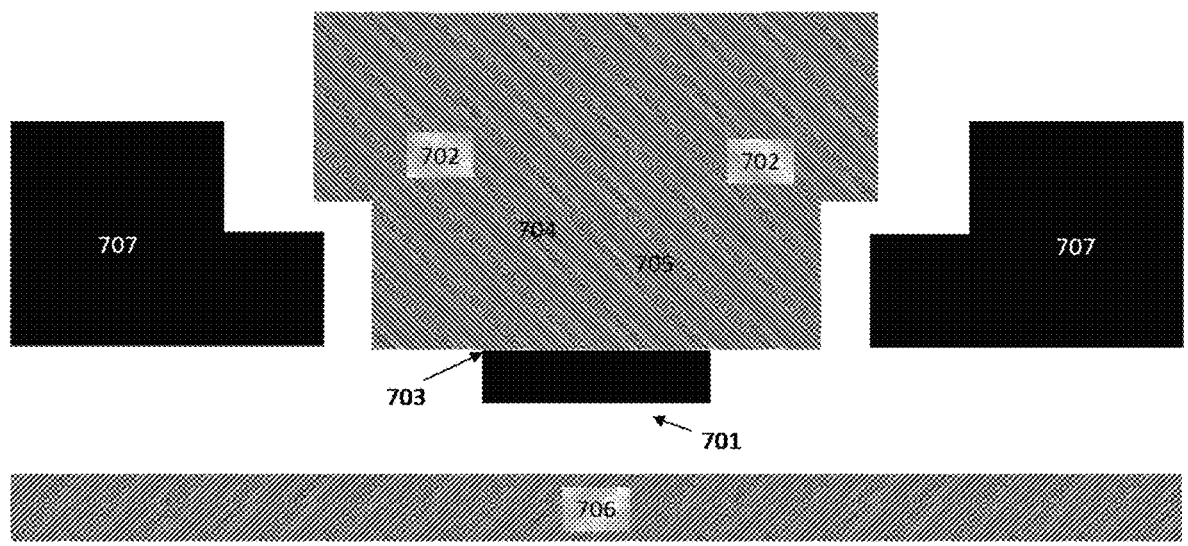
FIG. 7 shows an alternate embodiment of an OVJP jet head in which the micronozzle array is located on the face of a microfabricated die.

As shown in FIG. 7, an OVJP micronozzle array may have apertures cut into the face rather than the edge of a microfabricated die. The apertures may be present on the lower surface of the die 701 which is connected to a manifold 702 through connection 703, which may be a solder connection, a brazed connection, a bonding, glass frit, a ceramic adhesive, or other suitable connection. The face of the micronozzle array may be in a plane normal to its apertures, and may have one or more delivery apertures in fluid communication with the flow of inert carrier gas and organic vapor. The delivery apertures may be flanked on each side by exhaust apertures that are in fluid communication with the exhaust line. In some implementations, the face of the micronozzle array may have a different arrangement of delivery and exhaust apertures. The micronozzle configuration may include the delivery and exhaust apertures as the edge. The configuration as shown in FIG. 7 may include a jet head with an increased cross-sectional area facing the substrate, which may provide a greater rate of heat transfer to the substrate. The greater rate of heat transfer may be offset by greater material deposition rate, so that the dosage of heat received per area of substrate may be about the same or lower, when compared to an edge-on configuration discussed above. The manifold 702 may be joined to the micronozzle array using a solder or braze technique such as disclosed in U.S. Pat. No. 9,700,901. The manifold 702 may expose additional surface area to the substrate 706 for heat transfer and may require a substantial window through the cold plate 707.

Figure 8:
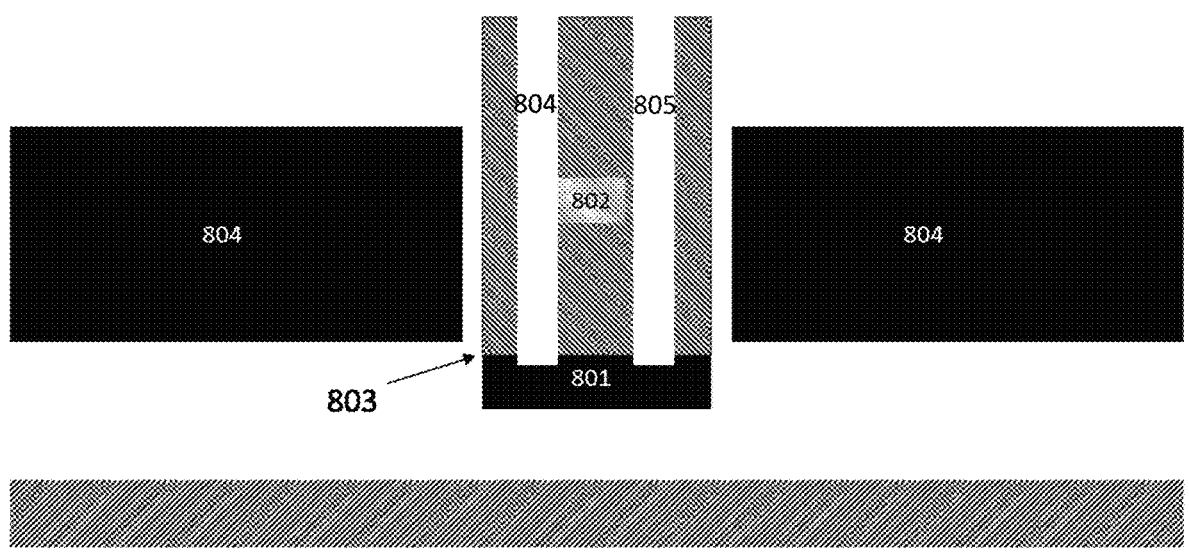
FIG. 8 shows an alternate embodiment an OVJP jet head in which the micronozzle array is located on the face of a microfabricated die that includes the gas distribution and opposing plate according to embodiments of the disclosed subject matter.

FIG. 8 shows an edge-on configuration similar to that shown in FIG. 3, but the configuration in FIG. 8 may be fabricated so that the plates present no more cross-sectional area to the substrate for heat transfer. The die 801 may connect directly to plates 802 by a seal 803, which may be a solder seal, a brazed seal, a bonding, glass frit, a ceramic adhesive seal, or other suitable seal. The plates 802 may include a first gas distribution plate and a second opposing plate. The plates 802 may extend through a window cut through a thicker portion of the cold plate 804 that is better able to absorb heat from the evaporation sources and the manifold connecting them to the plates 802. The plates may include one or more delivery runlines 805 that transfer organic vapor entrained in an inert carrier gas from evaporation source to the micronozzle array. The plates may also include an exhaust line 806 that is at reduced pressure with respect to the chamber and withdraws gas from underneath the die. Compact gas distribution and opposing plates may significantly reduce the amount of heat transferred to the substrate compared with one of previous construction, such as shown in FIG. 3.

FIG. 6 shows plots for the heat transmitted to the substrate as a function of jet head temperature for a jet head connected directly to plates 802 shown in FIG. 8 with the dark dashed line 605, and the dark solid line 606 for a jet head for the configuration that includes the cold plate 804. The cold plate 804 of FIG. 8 may reduce the heat load on the substrate by reducing the heated cross-sectional area to which the substrate is exposed. The configuration may allow more heat shielding around the micronozzle array. An overall heat transfer reduction of 11% may be expected.

The first gas distribution plate and a second opposing plate may provide a robust surface to use a mechanical seal, such as a metal o-ring, to seal the fluid path between the plates and a mating part or interface. Using such a seal on bare silicon may result in a high stress concentration and, most likely, may fracture before the seal could reach full seating pressure. Some embodiments of the disclosed subject matter may include soft deformable metal single-use gasket material fused to the plates at their detachable connection to the OVJP manifold.

In some printing and coating applications, it may be desirable to have a depositor array that matches the width of the substrate so that full coverage may be accomplished in a single pass. The channels of the plates (e.g., the gas distribution plate and the opposing plate) may be arrayed in a linear pattern to create long, thin gas distribution and opposing plates, which may be coupled to one or multiple microfluidic devices.

The print heads discussed above, such as in connection with FIG. 6, were modeled using the laminar flow and heat transfer packages in COMSOL Multiphysics. A nitrogen ambient and a room temperature thermal bath was assumed for all cases, with the micronozzle array situated 50 μm above the substrate and 1 mm below the fixture type evaluated. The cold plate and substrate platen were also at 20° C. and the platen carried a 0.7 mm thick glass substrate. The cold plate was 1 mm above the substrate. Four fixtures were evaluated.

Embodiments of the disclosed subject matter may provide an apparatus that includes a device having a micronozzle array disposed on a micro-fabricated fluidic die. The micronozzle array of the device may be disposed on an edge of the micro-fabricated fluidic die. The micronozzle array may be disposed on a face of the micro-fluidic die. The micro-fabricated fluidic die of the device may include at least one of silicon, quartz, and/or metal. The device may include a first gas distribution plate and a second opposing plate, where the micro-fabricated fluidic die is disposed between the first gas distribution plate and the second opposing plate. The first gas distribution plate may be irreversibly joined to the micronozzle array with a seal that is gas-tight, where the first gas distribution plate includes a plurality of sealed flow paths. A manifold may be reversibly joined to the first gas distribution plate, where the micro-fabricated fluidic die and the first gas distribution plate and the second opposing plate may be disposed between the manifold. The apparatus may include a thermally conductive plate in thermal contact with an active cooling source, where the thermally conductive plate may have at least one window passing through its full thickness through which the first gas distribution plate and the second opposing plate, a portion of the micro-fabricated fluidic die, and the micronozzle array of the device protrude such that a short axis of a cross-section of the window provides a clearance fit for the device across a range of motion relative to the thermally conductive plate. The apparatus may include one or more thermal evaporation sources in fluid communication with the first gas distribution plate where the manifold may in fluid communication with the micronozzle array through the plurality of sealed flow paths within the first gas distribution plate.

In some embodiments, the micronozzle array of the device may be disposed on an edge of the micro-fabricated fluidic die. The micronozzle array may be disposed on a face of the micro-fluidic die. The micro-fabricated fluidic die of the device may include at least one of silicon, quartz, and/or metal. The micronozzle array and a substrate of the apparatus may be configured to move relative to one another. The micro-fabricated fluidic die and the micronozzle array of the device may be comprised of silicon.

The second opposing plate of the device may be a second gas distribution plate. The manifold may be joined to the first gas distribution plate with a seal that is gas-tight.

At least one of the plurality of sealed flow paths of the device may be configured to carry a mixture of organic vapor and inert carrier gas.

The first gas distribution plate of the device may have a segment proximal to the micronozzle array through which all flow paths pass, and an aspect ratio of a depth of the segment is no more than 10% of the width or height of the segment, where the depth may be defined as a direction normal to a face of the micronozzle array.

The thermally conductive plate of the apparatus may shield objects upon which the micronozzle array acts from heat generated by the manifold and the plurality of evaporation sources. The thermally conductive plate may have a window that is lined with an insulative material, such as quartz, borosilicate glass, or the like. The micronozzle array and the first gas distribution plate may comprise at least a portion of the device that protrudes through the window of the thermally conductive plate such that the normal plane of the device is parallel to the depth dimension of the first gas distribution plate.

The seal of the device may be a gasket or a joint. The micronozzle array of the device may be irreversibly joined to the first gas distribution plate and the second opposing plate to form the seal using glass frit, ceramic adhesives, and/or a solder or braze compound with a reflow temperature that is greater than 350° C., or is greater than 500° C. That is, in some embodiments, non-metallic seals, such as high temperature glass frit or ceramic adhesives may be used. The first gas distribution plate of the device may include a material that has an average coefficient of thermal expansion of less than $6\times10^{-6}$ K$^{-1}$ between room temperature and a reflow temperature of the solder.

The first gas distribution plate and second opposing plate of the device may be fabricated from at least one of molybdenum, tungsten, kovar, aluminum nitride, and/or silicon nitride.

The apparatus may include a heater that is thermally coupled to the micronozzle array, where the heater is configured to heat the micronozzle array. The micronozzle array may direct convective jets of gas onto a surface of a substrate.

The first gas distribution plate and the second opposing plate of the device may include resistive heaters. The first gas distribution plate and second opposing plate of the device may include one or more thermally insulating materials selected from quartz, borosilicate glass, aluminum oxide, and/or mica. At least one of the first gas distribution plate and second opposing plate of the device may be configured for gas to be fed through.

The apparatus may include deformable metal gaskets, where the first gas distribution plate is sealed to the manifold using the deformable metal gaskets. The deformable metal gaskets may be reversibly sealed to the device. The deformable metal gaskets may be comprised of a material that is integrated with the manifold.

The first gas distribution plate of the device may be comprised of a plurality of etched or milled layers of material that are bonded together using a formation temperature greater than the reflow temperature of a material used to join the micronozzle array to the first gas distribution plate.

Embodiments of the disclosed subject matter may provide an apparatus that includes a device having a micronozzle array. The device may include a first gas distribution plate that is irreversibly joined to the micronozzle array with a seal that is gas-tight, where the first gas distribution plate includes a plurality of sealed flow path. One or more thermal evaporation sources of the device may be in fluid communication with the first gas distribution plate. The device may include a manifold, where the first gas distribution plate is reversibly joined to the manifold. The manifold may be in fluid communication with the micronozzle array through the plurality of sealed flow paths within the first gas distribution plate. At least one of these flow paths may carry a mixture of organic vapor and inert carrier gas. The first gas distribution plate may have a segment proximal to the micronozzle array through which all flow paths pass and a depth of the segment no wider than a depth of the micronozzle array at its point of attachment. The apparatus may include a thermally conductive plate, where the first gas distribution plate and the thermally conductive plate are in thermal contact with a source of active cooling. The thermally conductive plate may have at least one window passing through its full thickness through which the device may protrude such that a short axis of a cross section of the window has a dimension to provide a clearance fit at least for at least the micronozzle array of the device across a range of motion of the device relative to the thermally conductive plate so that the thermally conductive plate shields objects upon which the micronozzle array acts from heat generated by the manifold and the one or more thermal evaporation sources.

The seal of the device may be a gasket or a joint. The micronozzle array of the device may be irreversibly joined to the device using glass frit or ceramic adhesives, or a solder or braze compound with a reflow temperature may be greater than 350° C., or greater than 500° C. The first gas distribution plate may comprise a material that has an average coefficient of thermal expansion of less than $6\times10^{-6}$ $K^{-1}$ between room temperature and a reflow temperature of the solder. The device may comprise at least one of molybdenum, tungsten, kovar, aluminum nitride, and/or silicon nitride.

The device may include deformable metal gaskets, where the first gas distribution plate is sealed to the manifold using the deformable metal gaskets. The deformable metal gaskets may be reversibly sealed to the device. In some embodiments, the deformable metal gasket is comprised of a material that is integrated with the manifold.

The apparatus may include a heater that is thermally coupled to the micronozzle array, where the heater is configured to heat the micronozzle array.

The micronozzle array of the device may direct convective jets of gas onto a surface of a substrate. The micronozzle array and a substrate are configured to move relative to one another. The micronozzle array may be comprised of silicon.

The thermally conductive plate of the apparatus may comprise a window that is lined with an insulative material, such as quartz, borosilicate glass, or the like.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An apparatus comprising:

a device comprising:

a micronozzle array disposed on a micro-fabricated fluidic die;

a first gas distribution plate and a second opposing plate, wherein the micro-fabricated fluidic die is disposed between the first gas distribution plate and the second opposing plate, wherein the first gas distribution plate is irreversibly joined to the micronozzle array with a seal that is gas-tight, and wherein the first gas distribution plate includes a plurality of sealed flow paths; and a manifold reversibly joined to the first gas distribution plate, wherein the micro- fabricated fluidic die and the first gas distribution plate and the second opposing plate are disposed between the manifold; and a thermally conductive plate in thermal contact with an active cooling source, wherein the thermally conductive plate has at least one window passing through its full thickness through which the first gas distribution plate and the second opposing plate, a portion of the micro-fabricated fluidic die, and the micronozzle array of the device protrude such that a short axis of a cross-section of the window provides a clearance fit for the device across a range of motion relative to the thermally conductive plate;

one or more thermal evaporation sources in fluid communication with the first gas distribution plate, wherein the manifold is in fluid communication with the micronozzle array through the plurality of sealed flow paths within the first gas distribution plate.

2. The apparatus of claim 1, wherein the micronozzle array is disposed on an edge of the micro-fabricated fluidic die.

3. The apparatus of claim 1, wherein the micronozzle array is disposed on a face of the micro-fluidic die.

4. The apparatus of claim 1, wherein the second opposing plate is a second gas distribution plate, and wherein the manifold is joined to the first gas distribution plate with a seal that is gas-tight.

5. The apparatus of claim 1, wherein at least one of the plurality of sealed flow paths is configured to carry a mixture of organic vapor and inert carrier gas.

6. The apparatus of claim 1, wherein the thermally conductive plate shields objects upon which the micronozzle array acts from heat generated by the manifold and the plurality of evaporation sources.

7. The apparatus of claim 1, further comprising:
a heater that is thermally coupled to the micronozzle array,
wherein the heater is configured to heat the micronozzle array.

8. The apparatus of claim 1, wherein the micronozzle array directs convective jets of gas onto a surface of a substrate.

9. The apparatus of claim 1, wherein micronozzle array and a substrate are configured to move relative to one another.

10. The apparatus of claim 1, wherein the micro-fabricated fluidic die and the micronozzle array are comprised of silicon.

11. The apparatus of claim 1, wherein the thermally conductive plate comprises a window that is lined with an insulative material.

12. The apparatus of claim 11, wherein the micronozzle array and the first gas distribution plate comprise at least a portion of the device that protrudes through the window of the thermally conductive plate such that the normal plane of the device is parallel to the depth dimension of the first gas distribution plate.

13. The apparatus of claim 1, wherein the first gas distribution plate and the second opposing plate include resistive heaters.

14. The apparatus of claim 1, further comprising:
deformable metal gaskets,
wherein the first gas distribution plate is sealed to the manifold using the deformable metal gaskets.

15. An apparatus comprising:
a device comprising:
a micronozzle array;
a first gas distribution plate that is irreversibly joined to the micronozzle array with a seal that is gas-tight, wherein the first gas distribution plate includes a plurality of sealed flow paths;
one or more thermal evaporation sources in fluid communication with the first gas distribution plate; and
a manifold, wherein the first gas distribution plate is reversibly joined to the manifold,
wherein the manifold is in fluid communication with the micronozzle array through the plurality of sealed flow paths within the first gas distribution plate,
wherein at least one of these flow paths carries a mixture of organic vapor and inert carrier gas, and
wherein the first gas distribution plate has a segment proximal to the micronozzle array through which all flow paths pass and a depth of the segment no wider than a depth of the micronozzle array at its point of attachment, and
a thermally conductive plate, wherein the first gas distribution plate and the thermally conductive plate are in thermal contact with a source of active cooling, and
wherein the thermally conductive plate has at least one window passing through its full thickness through which the device may protrude such that a short axis of a cross section of the window has a dimension to provide a clearance fit at least for at least the micronozzle array of the device across a range of motion of the device relative to the thermally conductive plate so that the thermally conductive plate shields objects upon which the micronozzle array acts from heat generated by the manifold and the one or more thermal evaporation sources.

16. The apparatus of claim 15, further comprising:
a heater that is thermally coupled to the micronozzle array,
wherein the heater is configured to heat the micronozzle array.

17. The apparatus of claim 15, wherein the micronozzle array directs convective jets of gas onto a surface of a substrate.

18. The apparatus of claim 15, wherein micronozzle array and a substrate are configured to move relative to one another.

19. The apparatus of claim 15, wherein the thermally conductive plate comprises a window that is lined with an insulative material.

20. The apparatus of claim 15, further comprising:
deformable metal gaskets,
wherein the first gas distribution plate is sealed to the manifold using the deformable metal gaskets.

* * * * *